United States Patent
Hsieh et al.

(10) Patent No.: US 7,029,596 B2
(45) Date of Patent: Apr. 18, 2006

(54) COMPUTER INTEGRATED MANUFACTURING CONTROL SYSTEM FOR OXIDE CHEMICAL MECHANICAL POLISHING

(75) Inventors: Heng Chang Hsieh, Hsinchu (TW); Wen-Cheng Chien, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 479 days.

(21) Appl. No.: 10/307,675

(22) Filed: Dec. 2, 2002

(65) Prior Publication Data

US 2004/0149690 A1    Aug. 5, 2004

(51) Int. Cl.
*B44C 1/22*   (2006.01)
*C03C 15/00*  (2006.01)
*C03C 25/68*  (2006.01)
*C23F 1/00*   (2006.01)

(52) U.S. Cl. ............................................ 216/89; 84/85
(58) Field of Classification Search ................. 216/52, 216/53, 88, 89, 84, 85; 438/691, 692, 693; 451/36, 37, 56, 57, 58, 59, 60; 156/345.12, 156/345.13, 345.14
See application file for complete search history.

(56) References Cited

U.S. PATENT DOCUMENTS

| | | | | |
|---|---|---|---|---|
| 5,433,651 A | | 7/1995 | Lustig et al. | 451/6 |
| 5,655,949 A | * | 8/1997 | Clover | 451/41 |
| 5,664,987 A | * | 9/1997 | Renteln | 451/21 |
| 5,823,853 A | | 10/1998 | Bartels et al. | 451/5 |
| 5,865,665 A | * | 2/1999 | Yueh | 451/5 |
| 5,990,010 A | | 11/1999 | Berman | 438/691 |
| 6,120,347 A | | 9/2000 | Sandhu et al. | 451/5 |
| 6,517,412 B1 | * | 2/2003 | Lee et al. | 451/5 |
| 2003/0054644 A1 | * | 3/2003 | Patel et al. | 438/689 |

* cited by examiner

*Primary Examiner*—Parviz Hassanzadeh
*Assistant Examiner*—Roberts Culbert
(74) *Attorney, Agent, or Firm*—Thomas, Kayden, Horstemeyer & Risley

(57) ABSTRACT

A new method is provided that extends the process of automation of the CMP process by monitoring the in-line removal rate, by using methods of curve-fitting that enable a reduction in the frequency of monitoring the removal rate of the CMP process, by enhancing the life expectancy of the polishing pad thereby further reducing the frequency of the required Preventive Maintenance and by allowing for the polishing of non-standard lots of wafers.

5 Claims, 3 Drawing Sheets

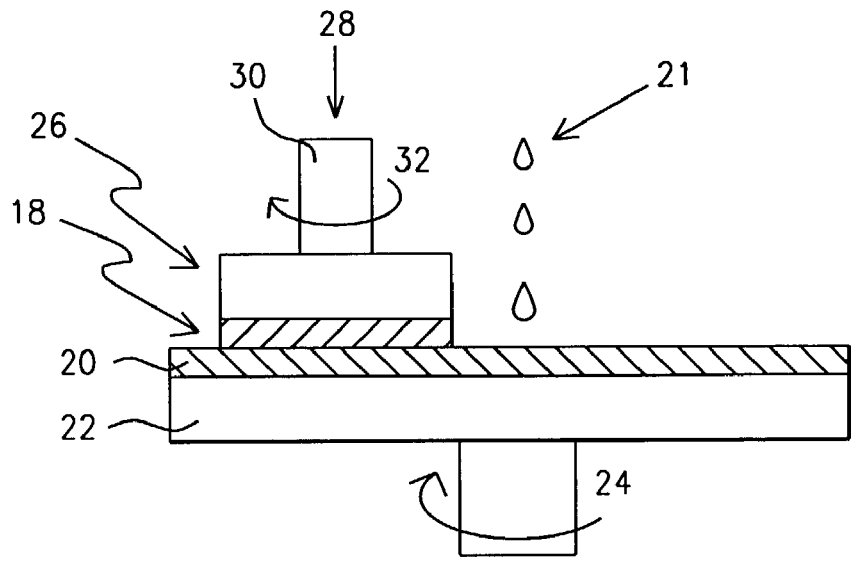
FIG. 1 – Prior Art
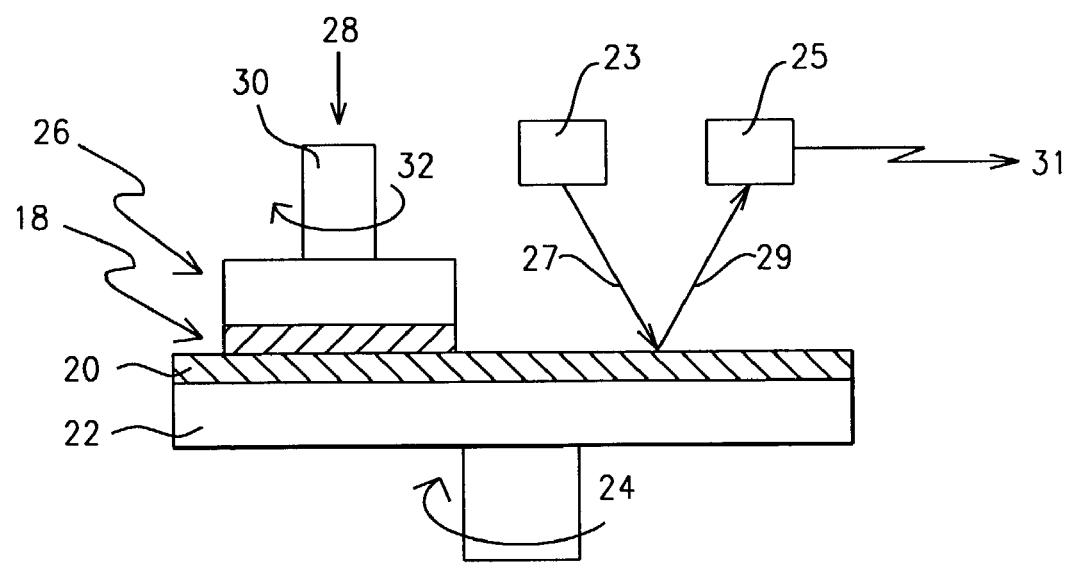
FIG. 2

COMPUTER INTEGRATED MANUFACTURING CONTROL SYSTEM FOR OXIDE CHEMICAL MECHANICAL POLISHING

BACKGROUND OF THE INVENTION (1) Field of the Invention

The invention relates to the fabrication of integrated circuit devices, and more particularly, to a method and methodology of automatically controlling the process of Chemical Mechanical Polishing (CMP) of a semiconductor surface.

(2) Description of the Prior Art

The first processing step during wafer processing typically is a step of cleaning the wafer surface in order to remove all impurities from the surface of the wafer. After this first step of cleaning is completed, the wafer surface typically is treated with organic compounds, such as acetone, trichloroethylene, methanol and ethanol, to remove organic impurities such as greases or hydrocarbons. As a final step in the cleaning process inorganic chemicals are used. These inorganic chemical mixtures are strong oxidants that form a thin oxide layer on the surface of the semiconductor wafer. As part of this process, this oxide layer is removed thereby removing the impurities that have been absorbed into the oxide layer.

The Chemical Mechanical Polishing process uses commercially available cleaning systems. These cleaning systems use a combination of rotating pads, each pad being in direct physical contact with the wafer surface. Due to a rotating movement of the polishing pad with respect to the wafer surface, the polishing pad planarizes by means of an abrasive action, the surface of the semiconductor wafer. The various turntables used for this purpose typically rotate at various controlled speeds, for instance 10 to 100 RPM, in a controlled clockwise or counterclockwise direction. The wafer is clamped and held, typically face downward, against the rotating polishing pad. The size of the diameter of the polishing pads is typically considerably larger than the size of the diameter of the semiconductor substrate. This means that more than one polishing pad can be arranged to simultaneously polish the surface of the wafer, these polishing pads typically being arranged in a circular patterns around the center of the wafer that is being polished.

Polishing pads are typically fabricated from a polyurethane and/or polyester base material and are commercially available such as models IC1000 or Scuba IV of a woven polyurethane material.

Chemical Mechanical Polishing (CMP) is a method of polishing materials, such as semiconductor substrates, to a high degree of planarity and uniformity. The process is used to planarize semiconductor slices prior to the fabrication of semiconductor circuitry thereon, and is also used to remove high elevation features created during the fabrication of the microelectronic circuitry on the substrate. One typical chemical mechanical polishing process uses a large polishing pad that is located on a rotating platen against which a substrate is positioned for polishing, and a positioning member which positions and biases the substrate on the rotating polishing pad. Chemical slurry, which may also include abrasive materials therein, is maintained on the polishing pad to modify the polishing characteristics of the polishing pad in order to enhance the polishing of the substrate.

Many of the CMP operations and the therewith related operations are being placed under automatic control for reasons of for instance increased throughput, improved performance and reduced cost of the CMP process, improved end-point control, and the like. The invention provides a method that further extends this process of automation of the CMP process by monitoring the in-line removal rate, by using methods of curve-fitting that enable a reduction in the frequency of monitoring the removal rate of the CMP process, by enhancing the life expectancy of the polishing pad thereby further reducing the frequency of the required Preventive Maintenance and by allowing for the polishing of non-standard lots of wafers.

U.S. Pat. No. 5,990,010 (Berman), U.S. Pat. No. 6,120,347 (Sandhu et al.) and U.S. Pat. No. 5,823,853 (Bartels et al.) show Chemical Mechanical Polishing (CMP) tools and control processes.

U.S. Pat. No. 5,433,651 (Lustig et al.) reveals a CMP tool and an in-situ monitoring and control process.

SUMMARY OF THE INVENTION

A principle objective of the invention is to enhance automation of the process of Chemical Mechanical Polishing of a semiconductor surface.

Another objective of the invention is to enhance automation of the process of Chemical Mechanical Polishing of a semiconductor surface, more specifically where this semiconductor surface comprises an oxide-based layer of dielectric.

Another objective of the invention is to improve the automatic control of the polishing rate of an oxide based layer.

Yet another objective of the invention is to improve the availability of the CMP polishing tool that is used for the polishing of an oxide based layer.

A still further objective of the invention is to improve the rework rate of polished semiconductor surfaces using the process of CMP for this polishing process.

A still further objective of the invention is to reduce the need for the use of a Control Wafer that is typically applied for calibration of a CMP process.

In accordance with the objectives of the invention a new method is provided that extends the process of automation of the CMP process by monitoring the in-line removal rate, by using methods of curve-fitting that enable a reduction in the frequency of monitoring the removal rate of the CMP process, by enhancing the life expectancy of the polishing pad thereby further reducing the frequency of the required Preventive Maintenance and by allowing for the polishing of non-standard lots of wafers.

BRIEF DESCRIPTION OF THE DRAWINGS

FIG. 1 shows a cross section of a conventional polishing arrangement.

FIG. 2 shows a cross section of a polishing arrangement that has been provided with a laser source and a laser receptor.

DESCRIPTION OF THE PREFERRED EMBODIMENTS

Figure 3A:
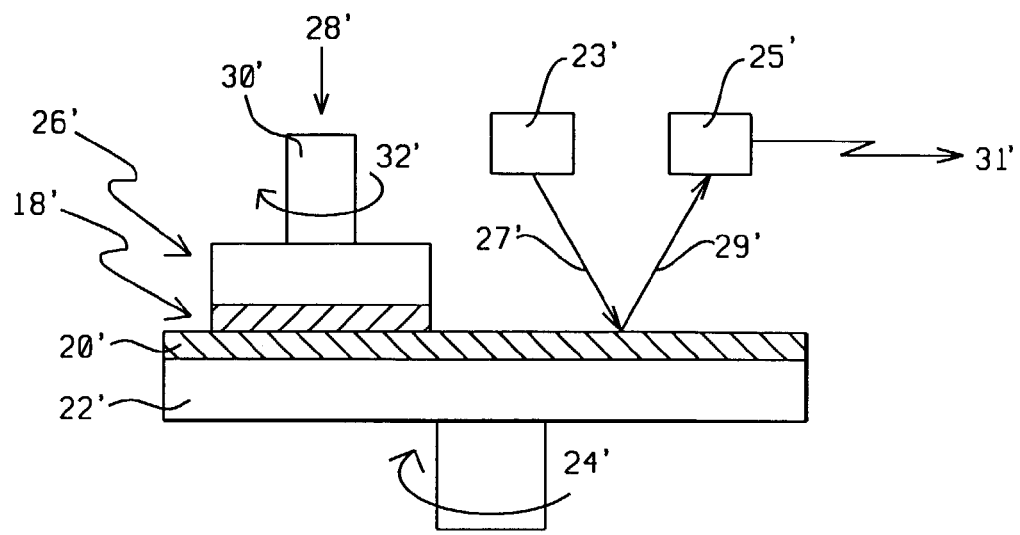
FIGS. 3a and 3b show cross sections of a dual platen polishing arrangement that has been provided with a laser source and a laser receptor.

One factor that contributes to the unpredictability and non-uniformity of the polishing rate of the CMP process is the non-homogeneous replenishment of slurry at the interface between the surface that is being polished and the polishing pad. The slurry is primarily used to enhance the rate at which selected materials are removed from the surface that is being polished. As a fixed volume of slurry, which is in contact with the surface that is being polished, reacts with selected materials on the surface that is being polished, this fixed volume of slurry becomes less reactive and the polishing enhancing characteristics of that fixed volume of slurry are significantly reduced. One approach that is used to overcome this problem is to continuously provide fresh slurry onto the polishing pad.

In the CMP process, semiconductor substrates are rotated, face down, against a polishing pad in the presence of abrasive slurry. Most commonly, the layer to be planarized is an electrical insulating layer, such as a layer of oxide based dielectric, overlaying active circuit devices. As the substrate is rotated against the polishing pad, an abrasive force grinds away the surface of the insulating layer. Additionally, chemical compounds within the slurry undergo a chemical reaction with the components of the insulating layer to enhance the rate of removal. By carefully selecting the chemical components of the slurry, the polishing process can be made more selective to one type of material than to another. For example, in the presence of potassium hydroxide, silicon dioxide is removed at a faster rate than silicon nitride. The ability to control the selectivity of a CMP process has led to increased use of the CMP process in the fabrication of complex integrated circuits.

Good planarity of semiconductor surfaces that are part of the creation of a semiconductor device is required to meet the requirements of optical projection lithography. Conventionally, two techniques have been applied to achieve planarity on a semiconductor surface, that is a Spin-On-Glass (SOG) etchback process is applied and a Chemical Mechanical Polishing (CMP) process is used to polish the exposed surface. Of these two methods, CMP has been shown to have a higher level of success in improving global planarity. A consistent height of semiconductor surface is required during semiconductor processing to assure adequate depth of focus of the lithography process.

The amount of material polished during the CMP process has been shown to be dependent upon the pattern density of the topography of the layers that are polished, e.g. the amount of material polished depends on the concentration of raised areas on the layer that is polished. In the art of polishing semiconductor wafers, the polishing time and the downforce exerted on a wafer by a polishing fixture are typically fixed, regardless of the topography of the particular layer being polished. It is well known in the art that the relationship between the removal rate of material during polishing, the downforce exerted on the wafer by a polisher, and the surface area that is being polished is best expressed by Preston's law. Preston's law states that the removal rate of material from a wafer is proportional to the downward pressure exerted on the wafer and inversely proportional to the surface area of the surface that is being polished that comes into contact with the polisher. Generally, for a fixed downward pressure, Preston's law shows that the removal rate of material increases as the polished surface decreases, and visa versa. As such, the material removal rate during CMP can very well be inconsistent from integrated circuit to integrated circuit, as well as to from layer to layer on a single wafer containing at least one integrated circuit, since the concentration of raised areas is typically widely variant from layer to layer.

For a more complex arrangement used for polishing a semiconductor surface, more than one surface may be polished at one time. Such a more complex arrangement can for instance comprise four wafers that are simultaneously mounted over a substrate table and that are simultaneously being polished by four independently rotating polishing pads. For such a more complex arrangement, in commonality with single surface polishing arrangements, the polishing action is frequently monitored by monitoring the Removal Rate (RR) that is accomplished by the polishing action. The Removal Rate is thereby defined as the reduction in the thickness of the layer that is being polished as a function of time, whereby the RR is calculated as the reduction in the thickness of the layer that is being polished per time unit. For instance, if the thickness of the layer that is being polished is reduced by an amount of X units of height over Y units of time, then the removal rate for this process is X/Y. For a more complex polishing arrangement, each of the polishing interfaces are characterized with a Removal Rate.

FIG. 1 shows a Prior Art CMP apparatus. A polishing pad 18 is attached to a circular polishing table 26 which rotates in a direction indicated by arrow 32 at a rate in the order of 1 to 100 RPM. A wafer carrier 22 is used to hold wafer 20 face up against the polishing pad 18. The wafer 20 is held in place by applying a vacuum to the backside of the wafer (not shown). The wafer carrier 22 also rotates as indicated by arrow 24, usually in the same direction as the polishing table 26, at a rate on the order of 1 to 100 RPM. Due to the rotation of the polishing table 26, the polishing pad 18 traverses a circular polishing path over the wafer 20. A force 28 is also applied in the downward vertical direction against wafer 20 and presses the wafer 20 against the polishing pad 18 as it is being polished. The force 28 is typically in the order of 0 to 15 pounds per square inch and is applied by means of a shaft 30 that is attached to the back of polishing table 26. Slurry 21 is provided to the top of the wafer 20 to further enhance the polishing action of polishing pad 18.

The following observations relating to the invention are of importance for a better understanding of the invention, these observations are:

1. The Base Removal Rate (RR) is determined using a monitor lot of wafers. Two different types of measurements can be performed in this context:
   (i) a first method of measurement is a traditional method using for instance a SDM300 (RR mode) apparatus, this method of RR measurement is performed off-line and is based on measuring layer thickness before and after the process of CMP
   (ii) the second method uses the Peak RR End Point mode. For the End Point part of this evaluation, a laser is focused on the wafer, the wafer reflects the laser light dependent on and indicative of the thickness of the layer that is being polished such as a layer of oxide; the reflected laser light provides a "signature" or clear indication in the shape of the reflected light that the end-point of the polishing process has been reached; this "signature" of the reflected laser light is identified by curve fitting of the reflected light against a reference pattern of reflected light; this method of Peak RR End Point mode measurement is performed in-situ, at significant variance with the highlighted first method; the indicated term of peak RR must be interpreted as being the RR where the layer has been removed by a desired amount, this desired amount being referred to as the peak or maximum amount (RR) of material that is required to be removed from the layer that is being polished.

2. The invention extends the life of a polishing pad by polishing under reduced pressure for the first ten hours of polishing. This rule applies to all polishing pads that are used during a polishing process. It is thereby also customary to initially "break-in" polishing pads by first using these polishing pads on a separate line, which has a lower removal rate than a regular polishing line. Current practice uses the same polishing conditions (recipe) for the life of the polishing pad. The change of polishing conditions can be made dependent on the length of time that a polishing pad has been used (pad or disk life), different polishing conditions can be provided by the host processor on which the Computer Integrated Manufacturing (CIM) function resides. For the latter application, the CIM functions are as follows:

The host CIM function requests polishing pad/disk life data from the polishing tool The host processor downloads different polishing conditions at the time that certain, pre-defined pad/disk life limits have been reached; this action is currently invoked every ten hours by an engineering support function but will under the methodology of the invention be invoked by the polishing tool; if the pad/disk life exceeds 10 hours, the host processor automatically downloads a new set of polishing conditions After the host processor has downloaded a new set of polishing conditions, the new polishing conditions are applied to the next new batch of wafers that is to be polished.

For a new batch of wafers that are to be polished, a monitoring run and quota test must first be performed The tool is placed in wait/Preventive Maintenance (PM) status at the time that the pad/disk reaches the life time limit 3. The in-situ, Peak RR End Point mode of measuring RR is based on curve fitting. Thereby, instead of including a single monitor in one-out-of every 4 lots, two monitors are included in one-out-of every 8 or more lots. After this, the removal rate is calculated by curve fitting whereby curve fitting is understood to consist of a process for generating a mathematical expression that, when plotted, closely fits a reference set of data points.

4. The methods of the invention and by using curve fitting to calculate the Removal Rate the frequency of monitoring the polishing process can be reduced.

5. Current practice of monitoring the progress of a CMP process, referred to as the regular RR measurement mode, is to measure the removal thickness (the thickness of the layer that is being removed while the process of CMP progresses) and from this removal thickness calculate the Removal Rate (RR). The invention further advances this method by making use of an end-point detection method, which reflects and represents a peak RR value. This removes the need for the conventional RR calculation. Specifically, the regular RR measurement mode follows a sequence of: measure the thickness of the layer that is being polished before the polishing process is initiated, use a Control Wafer, start the polishing of this Control Wafer and monitor the progress of the polishing as a function of time, measure the thickness of the polished layer after the polishing process is terminated, and from the removal thickness divided by the time during which the process of polishing was active calculate the Removal Rate (the reduction in the thickness of the polished layer per unit of time).

6. The new method of the invention, referred to as the Peak RR End-Point mode, uses a Control Wafer (C/W), this control wafer is polished, the polishing action is monitored using the method of peak end-point detection, again applying curve-fitting. At the time the polishing is terminated (because the end-point has been reached), the RR is calculated in-line.

7. The method of the invention can be applied to both Intra Level Dielectric (ILD) and Inter Metal Dielectric (IMD) and lends itself to being used in both regular RR measurement mode and in End-Point mode.

8. The convention can be established whereby the pre-thickness of the layer that is being polished is set to a standard value of 12,000 Angstrom, applicable to both layers of ILD and IMD.

9. The frequency of invoking the method of monitoring a polishing process may follow the conventions that off-line monitoring is performed only after Preventive Maintenance (PM) while daily monitoring is performed to validate the Removal Rate (RR).

10. Calculating the RR by curve-fitting uses characteristics of the CMP Removal Rate (RR) to develop an experimental formula, which is then used to forecast the next, projected or to be expected Removal Rate. The RR is calculated using methods of curve fitting, which eliminates the need for using a Control Wafer that conventionally is used to monitor a CMP process, which brings with it a reduced need for the application of Control Wafers.

As previously stated, the objectives of the invention address concerns of:

Increasing the level of automation that is implemented relating to the process of CMP Reducing the rate at which the process of CMP must be monitored Implementing an automatic method of monitoring the rate of particle removal that takes place during the process of CMP, and Provide a mechanism to existing process control specifications that reflects Removal Rate performance and requirements.

The invention is therefore characterized by the following aspects of design and implementation:

The invention provides for a Peak RR End Point mode measurement method, which uses curve fitting methodology, thereby providing for reducing the frequency (or rate) of monitoring the polishing process The invention provides for improved product flow and improved product logistics, thereby reducing the monitoring wait time, that is the time that typically elapses between scheduling a monitoring operation and the actual execution of this monitoring operation The invention provides a tracking function that tracks the level of particle-in and particle-out activity or flow, thereby increasing the degree of automation of the polishing process, and The invention provides an in-line monitoring mechanism for monitoring the Removal Rate, thereby allowing for a reduction in the Removal Rate if the process is no longer within specification.

The method of implementation of the Peak RR End Point mode measurement is highlighted in the cross section of FIG. 2, where, in addition to the convention elements that have previously been highlighted under FIG. 1, are also highlighted a source 23 of laser light, the laser light 27 is directed as the surface of wafer 20 from which it is reflected as light beam 29 and intercepted by the laser light analysis tool 25. Laser light receptor 25 interfaces with interface 31 to a software support function that resides on a CIM supporting computer, laser light receptor may performed additional functions of wave preparation prior to inputting the reflected laser light 29 to the CIM supporting function. The Peak RR End mode measurement function resides, under the arrangement as shown in schematic form in FIG. 2, on the same CIM supporting computer.

By providing for a dynamic, in-line method of monitoring the RR of a surface that is being polished, the invention can also be applied monitoring polishing performance of more that one polishing platen whereby these more than one polishing platen are part of the same polishing process and are therefore applied under the same conditions of surface polishing. This application is explained next.

Figure 3B:
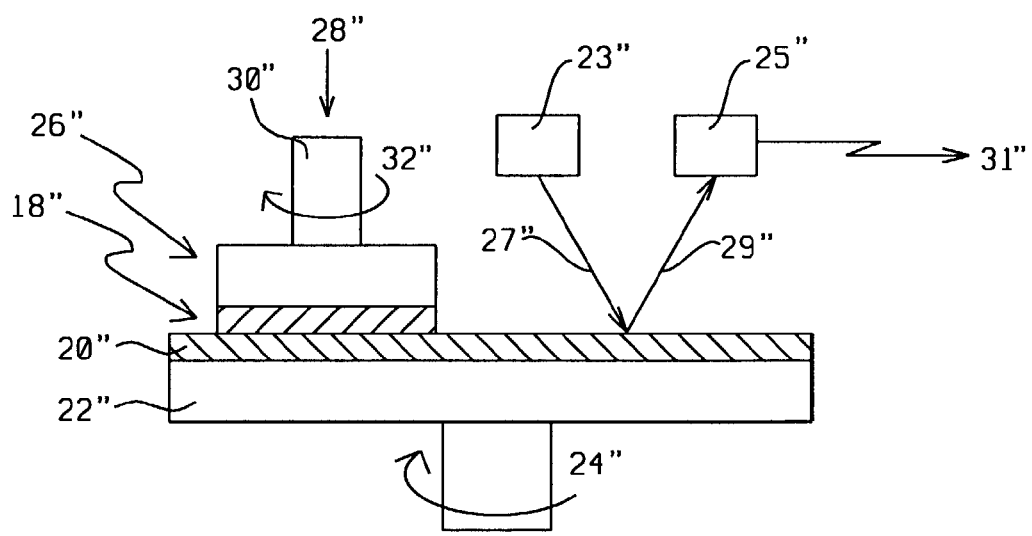

The concept of Peak RR End Point measurement having been extended to two polishing platens has been highlighted in the cross sections that are shown in FIGS. 3a and 3b. All the elements of the cross sections of FIGS. 3a and 3b correspond on a one-to-one basis with the elements that have been shown in FIG. 2, the elements of FIGS. 3a and 3b have been differentiated from the elements shown in FIG. 2 by providing single and double quotation marks to the elements of the cross sections of FIGS. 3a and 3b.

It must be understood relative to the cross sections that are shown in FIGS. 3a and 3b that the wafer surfaces 20' and 20" do not necessarily have to be equated with two different wafers but can be different surface areas or the same surface area of a wafer that is being polished by two polishing pads 18' and 18".

The conventional Computer Integrated Manufacturing (CIM) software support function is defined as follows, in this case specifically applied to monitor wafers simultaneously being polished on two platens:

The RR is calculated using the equation for a two-platen polishing arrangement:

$$RR=(RR1+RR2)/2$$

whereby: $RR1 = A1/(t1-B1)$ for platen 1 and $RR2=A2/(t2-B2)$ for platen 2 of these parameters: A1 is the removal thickness for platen 1

A2 is the removal thickness for platen 2

B1 is an offset value for platen 1

B2 is an offset value for platen 2 t1 is the polishing time for platen 1 t2 is the polishing time for platen 2 the values for A1, A2, B1 and B2 are measured by optical methods using conventional laser technology, the values for t1 and t2 are controlled by the host computer on which the CIM function resides.

As an extension of this calculation is applied, enabled by the in-situ Peak RR End Point measurement capability of the invention, that if the absolute vale of RR1−RR2>750, which is indicative of a significant difference of the polishing rate of the two platens, the system places a hold on the monitor wafer and invokes engineering intervention by creating a message stating that "RR between P1 and P1 larger than 750, wait for Engineering evaluation".

The Computer Integrated Manufacturing (CIM) functions that are provided or that are impacted by the invention are next highlighted, as CIM functions within this category have been identified:

Monitoring and controlling of the polishing pad

A curve-fitting Removal Rate function that implements a RR methodology with the objective of reducing the monitoring rate An endpoint RR control function RR control and endpoint mode functions, executed as a mixed polishing condition, and A control table that provides for special polishing conditions.

Details relating to the Removal Rate specification control functions are the following:

A mean value control quota

Uniformity control

A range that is in effect from polishing head to polishing head for the above referred to and more complex polishing arrangements, and A range that correlates a current RR with a previous RR.

System Functions that are germane to the methodology of the invention are the following:

Specify a tool ID, based on this tool ID a list of Equipment ID's can be obtained that form part of this tool ID A process description (recipe) of the process that is performed by this tool ID can be obtained Functions of inquiry, update, addition of new data and deletion of existing data are provided Limits that relate to the surface that is being polished are provided, can be entered, deleted and updated; these limits include an upper specification limit, an upper control limit, a lower control limit and a lower specification limit Specifications that relate to the individual platens of a previously referred to more complex polishing arrangement can be provided, such as for platen 1: the thickness of the layer that is being polished on that platen such as 4,000 Angstrom, the offset time for that platen such as 0 seconds; this can be specified for all the platens that are part of the polishing arrangement A platen formula may be applied to a particular platen, which specifies and controls special polishing conditions for that platen such as downward force applied, rate of slurry flow and the like Initial and expected RR can be specified A particle Monitoring Frequency can be specified, and An upper and lower limit of the Curve Fitting (CF) of the RR can be specified for a given polishing pad.

Additional System Functions that are germane to the methodology of the invention are the following:

A pre-used count, which allows the manufacturing operation to run one lot of product without waiting for a RR monitoring function to be executed A current manufacturing or fabrication (FB) value which depends on the previous value of RR, the current value of RR and the next value of RR Tool status and process mode, and Pad and disk life display.

More detail is next provided relating to the RR calculation, which makes use of curve fitting, as follows:

The formula for RR as this formula relates to Curve Fitting is as follows:

$$RR_{n+1}=RR_n-ABS(RR_n-RR_{n-1})/3, \text{ wherein:}$$

$RR_{n+1}$ is the next monitor curve fitting RR $RR_n$ is the current monitor curve fitting RR, and $RR_{n-1}$ is the previous monitor curve fitting RR.

The removal rate that is calculated by the above highlighted method of Curve fitting is of significant importance to the invention. This method uses characteristics of the removal rate of a CMP process and develops therefrom an experimental formula, which can be used to forecast the subsequent removal rate.

Following are highlighted rules of execution of the algorithm of the invention, which collectively indicate the conditions under which the Curve Fitting routine is to be executed, as follows:
1) at the time when RR is between the upper and the lower control limit ((ULC>RR>LCL)
2) the monitor count is equal to or larger than two
3) the pad life is within control limits
4) the value of CF is set equal to or larger than 1
5) the curve fitting function is not restraint by an old or to a new RR monitor
6) no process changes have taken effect, if process changes have been implemented, the quota Q must be reset.

The advantages of the Curve fitting function can be summarized as follows:
Reduces the use of the monitor wafer by about 50%
Increases tool capacity of the oxide-based dielectric deposition and polishing tool, such as a TEOS tool
Reduces loading of a monitor wafer by operator intervention, and
Increases tool availability and utilization.

Operational rules that apply to the algorithm of the invention, and more specifically apply to the specification limitations of the RR, are next detailed, as follows:
If $RR_n-RR_{n-1}>350$, the quota must be reset. The quota and the monitor count apply to the method of peak RR determination and to the method of convention RR determination. Engineering must re-monitor the removal rate.
If the RR the difference H1–H4>500, the quota must be reset. The quota and the monitor count apply to the method of peak RR determination and to the method of convention RR determination. Engineering must re-monitor the removal rate.
If the RR difference between Platen 1–Platen 2>750 for peak RR, the quota must be reset. The quota and the monitor count apply to the method of peak RR determination and to the method of convention RR determination. Engineering must re-monitor the removal rate, and
If the monitor RR is out-off spec or if a change in the process has occurred, the monitor must be reset.

One of the system functions is to perform downloading of different processing recipes as a function of different polishing pad or polishing disk life performance data. Disk life data is requested from the host processor, the host processor downloads different polishing cassette at the time that a certain disk life is reached, as follow:
1. For a disk life that is equal to or larger than 10 hours, the name of the downloaded cassette is defined as B/R
2. For a disk life that is less than 10 hours, the name of the downloaded cassette is defined by replacing the first letter of B/R with "N", for instance X65V60R.cas is changed to N65V60R.cas.

The curve fitting methodology and therewith associated factors, ground rules and other considerations are next highlighted in more detail.
1. Conventionally, the RR is monitored every four lots of product that have completed the process of polishing. Under the invention, the RR monitoring methodology extends to eight lots or more while the RR is calculated using curve fitting between two monitors. From the method of the invention follow a saving of the use of monitor wafers, in increase in the utilization of the dielectric, such as TEOS, processing tool, a reduction in operator intervention in order to load a monitor wafer and increased tool availability.
2. The frequency of monitoring is indicated by a Monitor Frequency (MF) or quota (Q), which is determined by the calculated RR.
3. The following limits are in force relating to the Removal Rate that are calculated using the methodology of the invention, these limits are determined by and inputted to the algorithm of the invention by an Engineering function such as Process Engineering (PE):
Upper Spec (US), for instance 4,000 Angstrom,
Upper Control Limit (UCL), for instance 3,800 Angstrom,
Lower Control Limit (LCL), for instance 2,800 Angstrom, and
Lower Spec (LS), for instance 2,700 Angstrom.
With these limits in mind, the following conditions of RR may arise in an actual polishing application:
1) RR>US, action required: inform PE for evaluation
2) UCL>RR>LCL with Q=8(12) and CF=1(2)
3) LCL>RR>LS with Q=4 and CF=0
4) RR<LS, action required: inform an engineering function, such as Quality Control, for PM
5) For the above indicated conditions, the monitor count progresses from 0 to 1 to 2, etc.
4. The number of executions of the monitor function, that is the monitor count, is added together, the curve fitting function is invoked at the time that the monitor count is equal to or larger than 2. At the time that the RR is out-of spec or at the time that a process change is affected, the monitor count must be rest and machine PM may be performed, tool operational parameters may have to be reset by engineering support at this time.

Next will be highlighted CIM functions that relate to the methodology of the invention.
1) CIM calculates the RR data and from this determines the monitor quota Q
2) the equation for the calculation of RR is as follows:
$RR_{n+1=RRn}$–ABS $(RR_n-RR_{n-1})/3$ wherein n–1 represents the previous monitor occurrence, n+1 represents the next monitor occurrence. If therefore n–1 has no monitor data, then $RR_{n-1}=RR_n$
3) off-line activities can be performed is the case where the value for $RR_{n+1}$ is calculated by the host processor and is displayed on the polishing tool, the value for RR can be used by engineering support functions to manually make adjustments.

Figure 4:
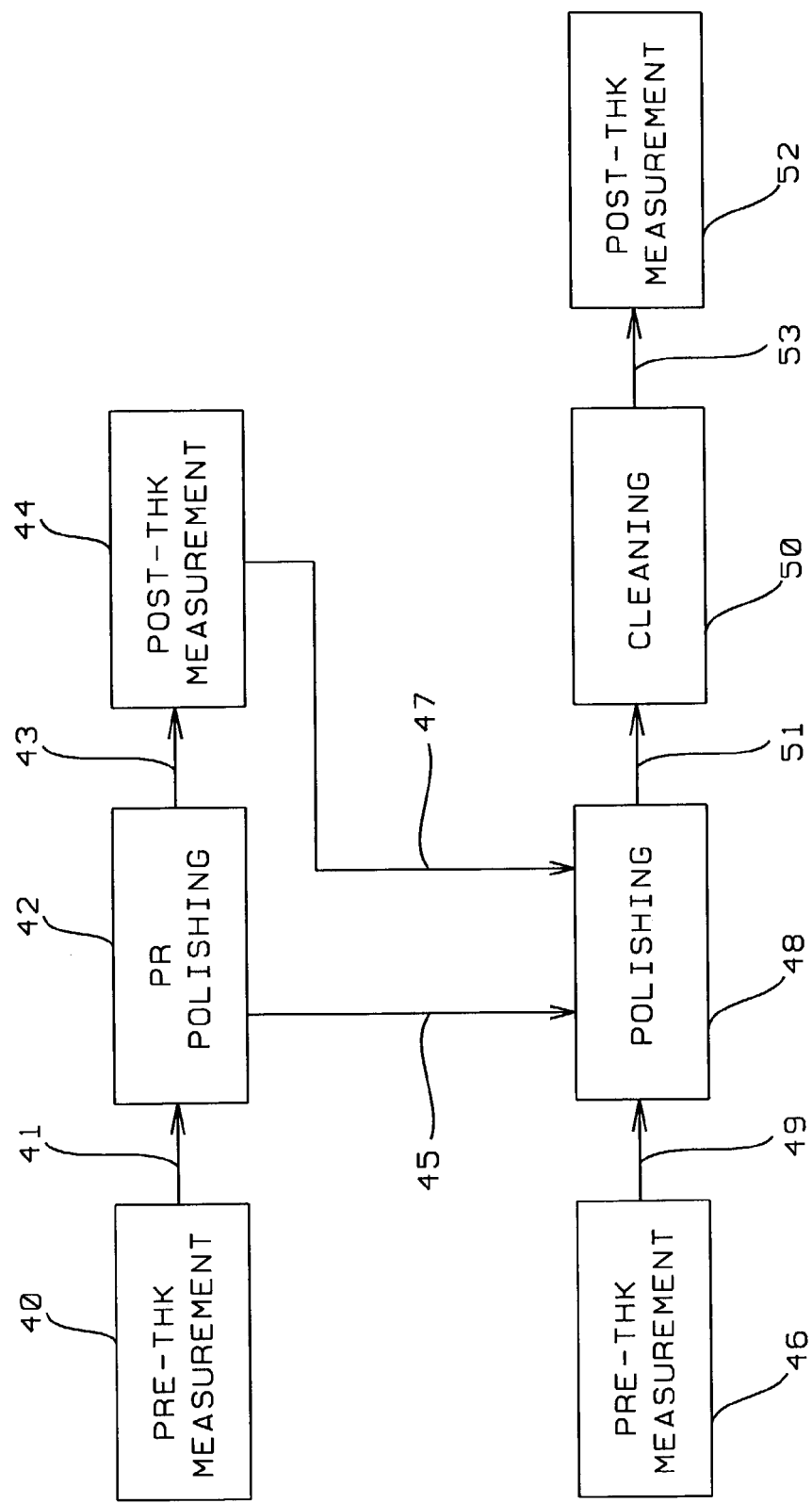
FIG. 4 shows a flow chart of the interaction between Removal Rates of a monitor wafer and production wafer.

FIG. 4 shows a flowchart of the interaction between monitoring activities and product flow whereby blocks 40/42/44 represent the monitoring activities and blocks 46, 48, 50 and 52 represent the product flow activities.
Specifically:
block 40 shows the pre-measurement of the thickness of the layer that is being polished using conventional methods as previously highlighted, the monitor wafer then proceeds via interface 41 to
block 40, which shows the polishing process of for instance polishing a layer of photoresist, after which, via interface 43, the monitor wafer proceeds to function
block 44, which shows the post-measurement of the thickness of the layer that has been polished using conventional methods; from these activities the RR is determined;
interface 45 provides the polishing conditions to the product flow functions
interface provides the post-polishing thickness measurements to the product flow functions block 46 is the pre-measurement of the thickness of the layer that is being polished using the conventional method of measuring layer thickness block 48, the actual polishing is performed after the pre-measurement of the thickness of the layer has been advanced to block 48 via interface 49; this polishing operation is monitored using the curve fitting function of the invention block 50, the polished wafer advances, via interface 51 to cleaning operation 50 block 52, the polished and cleaned wafer is, via interface 53 advanced to the post-measurement function 52, this post-measurement function uses conventional methods of thickness measurement.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method to determine a next base remove rate for polishing following lots of product, comprising:

providing a specification range and a control limit range within the specification range;

using a formula with previously-determined base remove rates to estimate the next base remove rate when a current base remove rate is within the control limit range; and polishing a monitor wafer to determine a remove rate as the next base remove rate when the current base remove rate is within the specification range but outside the control limit range.

2. The method to determine a current base remove rate of claim 1, wherein the step of polishing a monitor to determine the remove rate comprises:

measuring in off-line mode a thickness of a layer of semiconductor material before and after Chemical Mechanical Polishing (CMP).

3. The method to determine a current base remove rate of claim 1, wherein the step of polishing a monitor to determine the remove rate comprises:

performing an in situ CMP end-point detection during Chemical Mechanical Polishing (CMP) to determine the remove rate.

4. The method to determine a current base remove rate of claim 1, wherein the formula is $RR_{n+1}=RR_n-ABS(RR_n-RR_{n-1})/3$, where $RR_{n+1}$, $RR_n$, and $RR_{n-1}$ are the next, the current and a previous base remove rates, respectively; and ABS represents absolute value function.

5. The method to determine a current base remove rate of claim 1, wherein previously-determined base remove rates are determined by performing in situ CMP end-point detections during Chemical Mechanical Polishing (CMP).

* * * * *